(12) United States Patent
Wang et al.

(10) Patent No.: US 12,347,793 B2
(45) Date of Patent: Jul. 1, 2025

(54) SEMICONDUCTOR PACKAGE

(71) Applicant: Taiwan Semiconductor Manufacturing Company, Ltd., Hsinchu (TW)

(72) Inventors: Chin-Hua Wang, New Taipei (TW); Shu-Shen Yeh, Taoyuan (TW); Yu-Sheng Lin, Hsinchu County (TW); Po-Yao Lin, Hsinchu County (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 47 days.

(21) Appl. No.: 18/518,466

(22) Filed: Nov. 23, 2023

(65) Prior Publication Data

US 2024/0088063 A1 Mar. 14, 2024

Related U.S. Application Data

(63) Continuation of application No. 17/874,308, filed on Jul. 27, 2022, now Pat. No. 11,862,580, which is a continuation of application No. 17/152,797, filed on Jan. 20, 2021, now Pat. No. 11,450,622.

(51) Int. Cl.
*H01L 23/12* (2006.01)
*H01L 23/00* (2006.01)
*H01L 23/367* (2006.01)
*H01L 23/498* (2006.01)

(52) U.S. Cl.
CPC ........ *H01L 23/562* (2013.01); *H01L 23/3677* (2013.01); *H01L 23/49816* (2013.01)

(58) Field of Classification Search
CPC ............... H01L 23/562; H01L 23/3677; H01L 23/49816
See application file for complete search history.

(56) References Cited

U.S. PATENT DOCUMENTS

| | | | | |
|---|---|---|---|---|
| 6,534,723 | B1 * | 3/2003 | Asai ................... | H01L 23/49811 174/262 |
| 2009/0175023 | A1 * | 7/2009 | Sakamoto ......... | H01L 23/49822 216/13 |
| 2010/0116529 | A1 * | 5/2010 | Niki .................. | H01L 23/49822 228/159 |
| 2010/0213600 | A1 * | 8/2010 | Lau ..................... | H01L 23/5384 438/122 |

(Continued)

*Primary Examiner* — Thao P Le
(74) *Attorney, Agent, or Firm* — JCIPRNET

(57) ABSTRACT

A semiconductor package provided herein includes a wiring substrate, a semiconductor component, conductor terminals, a bottom stiffener and a top stiffener. The wiring substrate has a first surface and a second surface opposite to the first surface. The semiconductor component is disposed on the first surface of the wiring substrate. The conductor terminals are disposed on the second surface of the wiring substrate and electrically connected to the semiconductor component through the wiring substrate. The bottom stiffener is disposed on the second surface of the wiring substrate and positioned between the conductor terminals. The top stiffener is disposed on the first surface of the wiring substrate. The top stiffener is laterally spaced further away from the semiconductor component than the bottom stiffener.

20 Claims, 13 Drawing Sheets

(56) References Cited

U.S. PATENT DOCUMENTS

| | | | |
|---|---|---|---|
| 2012/0111616 A1* | 5/2012 | Inoue | H05K 3/4007 |
| | | | 228/180.1 |
| 2015/0380343 A1* | 12/2015 | Koontz | H01L 21/4825 |
| | | | 257/621 |
| 2019/0267332 A1* | 8/2019 | Sikka | H01L 23/49866 |

* cited by examiner

SEMICONDUCTOR PACKAGE

CROSS-REFERENCE TO RELATED APPLICATION

This application is a continuation application of and claims the priority benefit of a prior U.S. application Ser. No. 17/874,308, filed on Jul. 27, 2022. The prior application is a continuation of and claims the benefit of a prior U.S. application Ser. No. 17/152,797, filed Jan. 20, 2021, now patented. The entirety of each of the above-mentioned patent application is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for reliable packaging techniques of semiconductor dies with desirable structural stability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
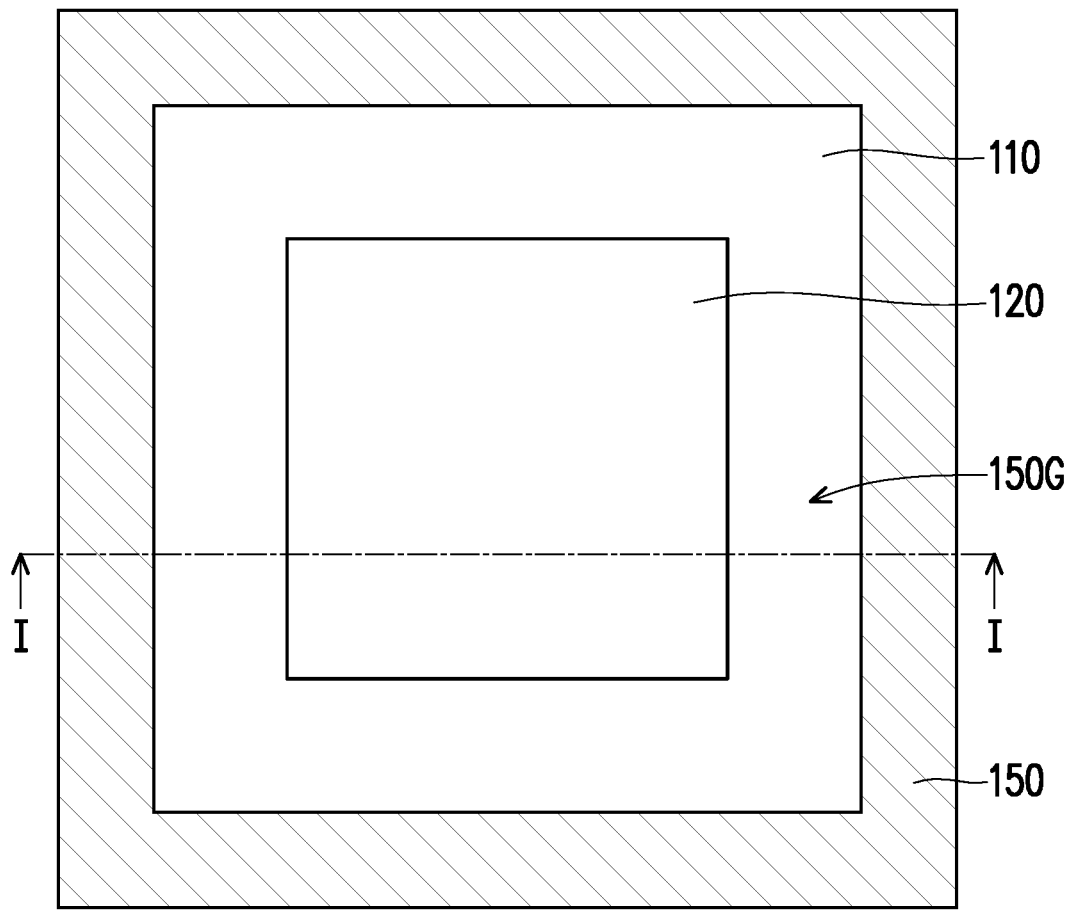
FIG. 1 schematically illustrates a top view of a semiconductor package in accordance of some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 2:
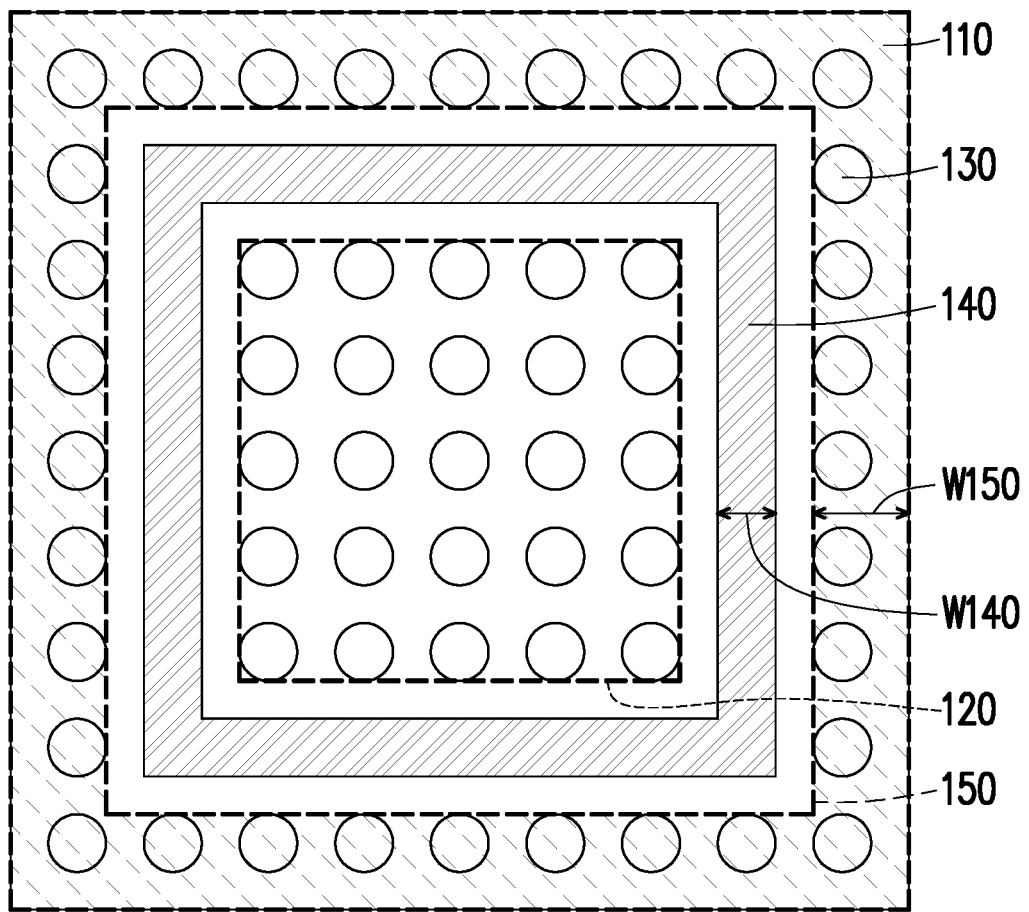
FIG. 2 schematically illustrates a bottom of a semiconductor package in accordance of some embodiments of the disclosure.

FIG. 1 and FIG. 2 schematically illustrate a top view and a bottom of a semiconductor package in accordance of some embodiments of the disclosure. Referring to FIGS. 1 and 2, a semiconductor package 100 includes a wiring substrate 110, a semiconductor component 120, conductor terminals 130, a bottom stiffener 140 and a top stiffener 150. The wiring substrate 110 has a first, top surface that is the surface shown in FIG. 1 and a second, bottom surface that is the surface shown in FIG. 2. The semiconductor component 120 and the top stiffener 150 are disposed on the first surface of the wiring substrate 110 as shown in FIG. 1. The conductor terminals 130 and the bottom stiffener 140 are disposed on the second surface of the wiring substrate 110. For illustration purpose, the semiconductor component 120 and the top stiffener 150 are also presented in FIG. 2 by using dash lines.

The bottom stiffener 140 and the top stiffener 150 each has a quadrangular ring-like shape in the plane views such as the top view or the bottom view. In some embodiments, the pattern of the bottom stiffener 140 and the top stiffener 150 may be designed based on the various design. For example, the bottom stiffener 140 or the top stiffener 150 may have a linear shape, L shape, U shape, dot shape, etc. According to the arrangements of the components shown in the plane views, the bottom stiffener 140 surrounds the semiconductor component 120 and the top stiffener 150 surrounds the bottom stiffener 140. The bottom stiffener 140 may partially or completely overlap the semiconductor component 120 while the top stiffener 150 may not overlap the semiconductor component 120. In some embodiments, the bottom stiffener 140 does not overlap the top stiffener 150. The bottom stiffener 140 and the top stiffener 150 both have higher Young's modulus than the wiring substrate 110 so that the mechanical property of the wiring substrate 110 is reinforced and a warpage of the semiconductor package 100 is mitigated or avoided. In FIG. 2, the bottom stiffener 140 may keep a distance from the semiconductor component 120, but the disclosure is not limited thereto. In some embodiments, the bottom stiffener 140 may overlap the periphery of the semiconductor component 120.

The wiring substrate 110 includes a dielectric core layer, build-up or laminated dielectric layers stacked over opposite surfaces of the dielectric core layer, conductive wiring layers embedded in the build-up or laminated dielectric layers, conductive vias penetrating through the dielectric core layer and the build-up or laminated dielectric layers. The semiconductor component 120 is mounted on the first surface of the wiring substrate 110. The semiconductor component 120 includes at least one semiconductor die, and related connection devices and is electrically connected to the conductive wirings of the wiring substrate 110. In some embodiments, the semiconductor component 120 may include a molding material (not shown) laterally encapsulating the semiconductor die(s) and an interposer (not shown) disposed between the semiconductor die(s) and the wiring substrate 110.

The conductor terminals 130 are formed on the second surface of the wiring substrate 110 and electrically connected to the bottommost (farthest from the semiconductor component 120) conductive wiring layer of the wiring substrate 110. The conductor terminals 130 are arranged in an array to form a ball-grid array (BGA) and are used for electrically connecting the semiconductor package 100 to an external device such as a circuit board (for example, a printed circuit board). Each of the conductor terminals 130 may include a eutectic material such as solder, although any suitable materials may alternatively be used.

The bottom stiffener 140 is disposed beside the conductor terminals 130. In some embodiments, the bottom stiffener 140 is located between the conductor terminals 130. Specifically, the bottom stiffener 140 has a ring-like shape. Some of the conductor terminals 130 are positioned within the region surrounded by the ring-like bottom stiffener 140 and some of the conductor terminals 130 are position outside the ring-like bottom stiffener 140. The conductor terminals 130 are electrically connected to the semiconductor component 120 at the first surface of the wiring substrate 110 through the conductive wiring layers formed in the wiring substrate 110.

The top stiffener 150 is disposed beside the semiconductor component 120 and is made of a material such as metal, stainless steel, steel, etc. The top stiffener 150 is a bulk metallic structure that involves desirable heat dissipation effect and mechanical property. The bottom stiffener 140 and the top stiffener 150 on opposite surfaces of the wiring substrate 110 form no electric connection to the wiring substrate 110, the semiconductor component 120 and the conductor terminals 130. The paths of electrical signals of the semiconductor component 120 may not pass through either the bottom stiffener 140 or the top stiffener 150.

The bottom stiffener 140 is positioned between the top stiffener 150 and the semiconductor component 120. Specifically, the top stiffener 150 keeps a gap 150G from the semiconductor component 120 and the bottom stiffener 140 may be positioned overlapping the gap 150G without overlapping the top stiffener 150 such that the top stiffener 150 is laterally spaced further away from the semiconductor component 120 than the bottom stiffener 140, but the disclosure is not limited thereto. In some embodiments, a width W140 of the bottom stiffener 140 is smaller than a width W150 of the top stiffener 150. In the disclosure, the widths of two elements that are compared with each other are measured in the same measure line crossing through the two elements. Alternatively, the widths of two elements that are compared with each other are measured in the same cross section of the semiconductor package 100 that is taken along a straight linear line. In some embodiments, the width W150 of the top stiffener 150 may be greater than 3 mm and smaller than a width difference of the semiconductor package 100 and the semiconductor component 120. In some embodiments, the width W140 of the bottom stiffener 140 may be smaller than 1 mm and may be similar to the dimeter of the conductor terminals 130.

In some embodiments, the semiconductor component 120 has a coefficient of thermal expansion (CTE) smaller than the wiring substrate 110. For example, the semiconductor component 120 may include at least one semiconductor die having a CTE of about 3 ppm and the wiring substrate 110 may have an effective CTE of about 14 ppm. The mismatch of CTE between the semiconductor component 120 and the wiring substrate 110 would result in additional stress in the semiconductor package 100 under temperature changes. The bottom stiffener 140 and the top stiffener 150 both have a Young's modulus higher than the wiring substrate 110 so that the mechanical property of the wiring substrate 110 is reinforced to bear the stress caused by the mismatch of CTE between the semiconductor component 120 and the wiring substrate 110. For example, the wiring substrate 110 is prevented from warpage under the temperature changes, which improves yield and reliability of the semiconductor package 100.

The bottom stiffener 140 has a Young's modulus greater than about 100 Gpa and less than about 1,200 Gpa. The bottom stiffener 140 has a CTE less than about 10 ppm and greater than about 1 ppm. In some embodiments, a material of the bottom stiffener 140 includes, for example, silicon, silicon carbide, tungsten, tungsten carbide, etc. In some embodiments, the material of the bottom stiffener 140 is different from a material of the top stiffener 150. The material of the top stiffener 150 may include copper, stainless steel, steel, metal alloy, or the like. Both the bottom stiffener 140 and the top stiffener 150 reinforce the mechanical property of the semiconductor package 100 and thus the yield and the reliability of the semiconductor package 100 are improved.

Figure 3:
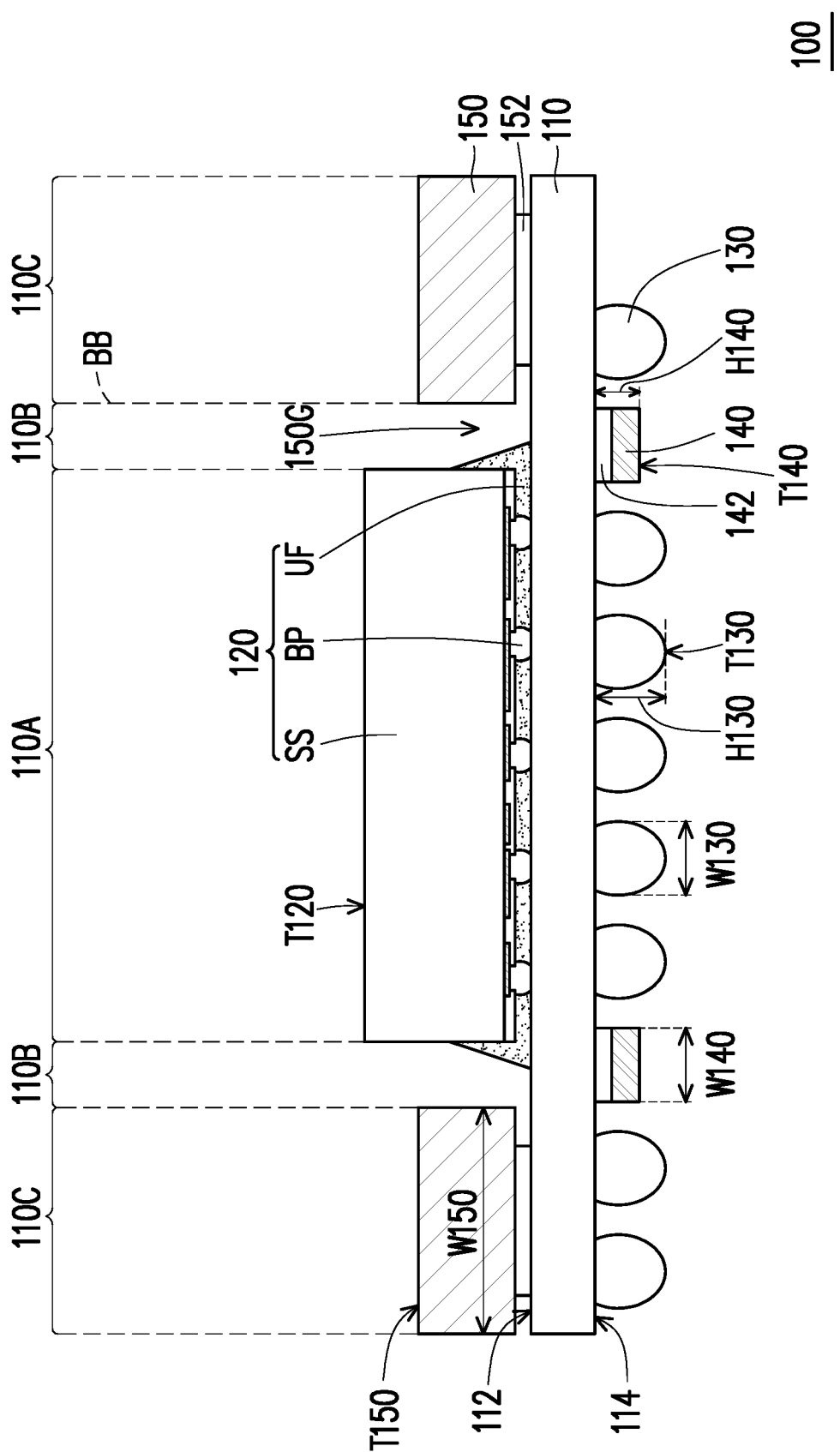
FIG. 3 schematically illustrates a cross sectional view of a semiconductor package taken along line I-I of FIG. 1.

FIG. 3 schematically illustrates a cross sectional view of a semiconductor package taken along line I-I of FIG. 1. The semiconductor package 100 is similar to the semiconductor package depicted in FIGS. 1 and 2 and includes the wiring substrate 110, the semiconductor component 120, the conductor terminals 130, the bottom stiffener 140 and the top stiffener 150 that are described in the descriptions for FIG. 1 and FIG. 2. Specifically, FIG. 3 further presents at least a portion of the details of the semiconductor component 120 and the connection relationship of the wiring substrate 110, the semiconductor component 120, the conductor terminals 130, the bottom stiffener 140 and the top stiffener 150 in a cross sectional view.

The semiconductor component 120 includes at least one singulated structure SS, conductive bumps BP and an underfill UF. The singulated structure SS may include semiconductor die (not shown), a molding material (not shown) surrounding and encapsulating the semiconductor die, and an interposer (not shown) carrying the encapsulated semiconductor die(s). In some embodiments, the singulated structure SS may be singulated from a packaged wafer. The conductive bumps BP are formed on the singulated structure SS at the surface facing the wiring substrate 110. Specifically, the semiconductor component 120 is mounted onto the first surface 112 of the wiring substrate 110 through the conductive bumps BP by performing a wafer-level bumping process. The underfill UF is disposed between the singulated structure SS and the wiring substrate 110 to fill gaps between the conductive bumps BP. The semiconductor package 100 may be a Chip-on-Wafer-on-Substrate (CoWoS) package.

The bottom stiffener 140 is adhered onto the second surface 114 of the wiring substrate 110 through an adhesive 142 and the top stiffener 150 is adhered onto the first surface 112 of the wiring substrate 110 through an adhesive 152. In some embodiments, the material of the adhesive 142 may be the same as the adhesive 152. The top stiffener 150 keeps the gap 150G from the semiconductor component 120. In some embodiments, the underfill UF may be formed after the top stiffener 150 being adhered onto the wiring substrate 110 and the gap 150G facilitates the proceeding of forming the underfill UF. The width of the gap 150G may be sufficient to allow the formation of the underfill UF, but the disclosure is not limited thereto.

The wiring substrate 110 may divide into a center region 110A, a first peripheral region 110B surrounding the center region 110A and a second peripheral region 110C surrounding the first peripheral region 110B. The semiconductor component 120 is disposed on the first surface 112 of the wiring substrate 110 at the center region 110A. In some embodiments, an orthogonal projection of the semiconductor component 120 onto the wiring region 100A defines the center region 110A. The top stiffener 150 is disposed on the first surface 112 of the wiring substrate 110 at the second peripheral region 110C. The top stiffener 150 defines the second peripheral region 110C of the wiring substrate 110. The first peripheral region 110B is corresponding the gap 150G between the semiconductor component 120 and the top stiffener 150.

In the embodiment, a boundary BB is formed between the first peripheral region 110B and the second peripheral region 110C. The top stiffener 150 is disposed on the wiring substrate 110 away from the semiconductor component 120 from the boundary BB between the first peripheral region 110B and the second peripheral region 110C. The bottom stiffener 140 is located at least partially in the first peripheral region 110B without exceeding the boundary BB. In some embodiments, the bottom stiffener 140 is completely located within the area demarked by the boundary BB. Alternatively, the bottom stiffener 140 may be completely located outside the second peripheral region 110C. In some embodiments, the bottom stiffener 140 may partially or completely locate within the center region 110A so that the bottom stiffener 140 may at least partially overlap the semiconductor component 120 while not overlapping the top stiffener 150. In some embodiments, the bottom stiffener 140 may keep a distance from the edge of the semiconductor component 120 as presented in FIG. 1.

A distal surface T140 of the bottom stiffener 140 away from the wiring substrate 110 is leveled between the second surface 114 of the wiring substrate 110 and a distal surface T130 of one conductor terminal 130 away from the wiring substrate 110. In other words, the distal surface T140 of the bottom stiffener 140 keeps a distance H140 from the second surface 114 of the wiring substrate 110, the distal surface T130 of the conductor terminal 130 keeps a distance H130 from the second surface 114 of the wiring substrate 110, and the distance H130 is not smaller than the distance H140. Usually, the distance H140 is smaller than the distance H130. The conductor terminal 130 is relatively protruded further from the wiring substrate 110 than the bottom stiffener 140 so that the conductor terminal 130 may be connected to and in contact with an external device without difficulty. In some embodiments, the width W140 of the bottom stiffener 140 in the cross section of FIG. 3 may be proximate to a width W130 of one conductor terminal 130.

A top surface T150 of the top stiffener 150 is leveled between the first surface 112 of the wiring substrate 110 and a top surface T120 of the semiconductor component 120 away from the first surface 112 of the wiring substrate 110. In other words, the top surface T120 of the semiconductor component 120 is further from the first surface 112 than the top surface T150 of the top stiffener 150. In some embodiments, another component such as a heat sink may be attached to the semiconductor component 120 on the top surface T120 without difficulty.

The wiring substrate 110 and the semiconductor component 120 have different CTEs. For example, a semiconductor die in the semiconductor component 120 may have a CTE of 3 ppm and the wiring substrate 110 may have an effective CTE of 14 ppm. The material of the bottom stiffener 140 has low CTE and high Young's modulus. The bottom stiffener 140 located proximate to and/or overlapping the semiconductor component 120 helps to reinforce the mechanical property of the semiconductor package 100 so that the damage caused by the CTE mismatch between the wiring substrate 110 and the semiconductor component 120 may be mitigated or prevented.

The width W140 of the bottom stiffener 140 is smaller than a width W150 of the top stiffener 150. In some embodiments, a volume of the bottom stiffener 140 is less than a volume of the top stiffener 150. The material of the top stiffener 150 may include copper, stainless steel, steel, metal alloy or the like. The bulk metallic top stiffener 150 also helps to enhance the mechanical property of the semiconductor package 100 so that the damage caused by the CTE mismatch between the wiring substrate 110 and the semiconductor component 120 may be mitigated or prevented.

Figure 4:
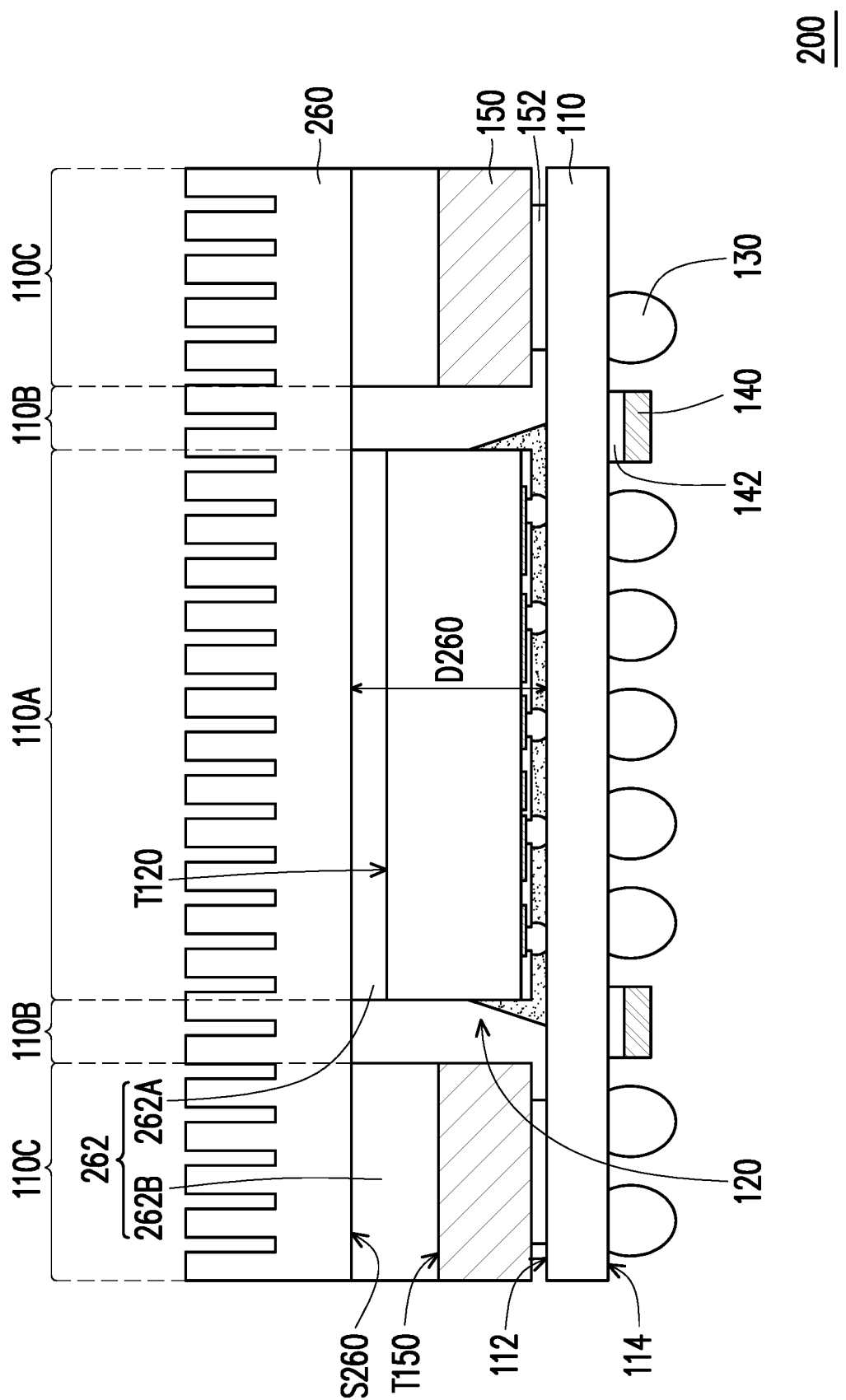
FIG. 4 schematically illustrates a cross sectional view of a semiconductor package taken in accordance with some embodiments.

FIG. 4 schematically illustrates a cross sectional view of a semiconductor package taken in accordance with some embodiments. The semiconductor package 200 includes the wiring substrate 110, the semiconductor component 120, the conductor terminals 130, the bottom stiffener 140 and the top stiffener 150 that are described in above and further includes a heat sink 260. The structures, the disposition relationships, the materials and the properties of the wiring substrate 110, the semiconductor component 120, the conductor terminals 130, the bottom stiffener 140 and the top stiffener 150 may refer to the previous embodiments depicted in at least one of FIGS. 1 to 3 and are not reiterated here. In the embodiment, the heat sink 260 is attached onto the top surface T120 of the semiconductor component 120 through a thermal interface material (TIM) 262.

The heat sink 260 is thermally coupled to the top surface T120 of the semiconductor component 120 and thermally coupled to the top surface T150 of the top stiffener 150 through the thermal interface material 262. The thermal interface material 262 include a portion 262A on the top surface T120 of the semiconductor component 120 and a portion 262B on the top surface T150 of the top stiffener 150. The heat sink 260 has a planar coupling surface S260 facing the wiring substrate 110. A distance D260 between the coupling surface S260 of the heat sink 260 and the first surface 112 of the wiring substrate 110 is identical at the center region 110A, the first peripheral region 110B and the second peripheral region 110C. In some embodiments, a thickness of the portion 262B of the thermal interface material 262 is greater than a thickness of the portion 262A of the thermal interface material 262. The portion 262B of the thermal interface material 262 and the portion 262A of the thermal interface material 262 are made of the material having desirable heat dissipation effect.

The material of the heat sink 260 may include copper, aluminum, cobalt, copper coated with nickel, stainless steel, tungsten, silver diamond, aluminum silicon carbide or the like. The material of the thermal interface material 262 may include metallic TIM, such as indium (In) sheet or film, indium foil, indium solder, silver (Ag) paste, silver alloy or combination thereof. The thermal interface material 262 may also be polymer-based TIM with thermal conductive fillers. Applicable thermal conductive filler materials may include aluminum oxide, boron nitride, aluminum nitride, aluminum, copper, silver, indium, a combination thereof, or the like. The thermal interface material 262 may include film-based or sheet-based material such as sheet with synthesized carbon nano-tube (CNT) structure integrated into the sheet, thermal conductive sheet with vertically oriented graphite fillers or the like.

Figure 5:
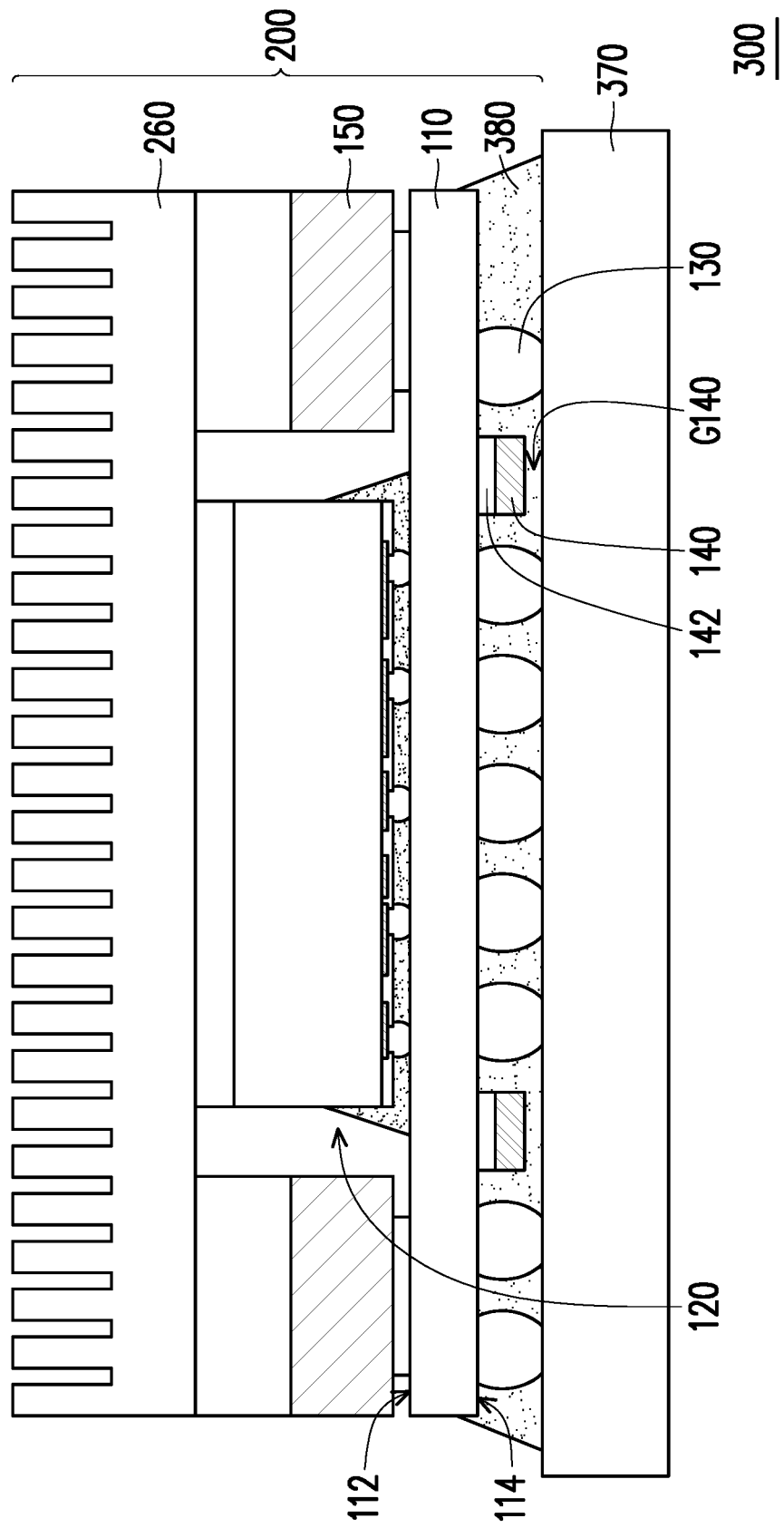
FIG. 5 schematically illustrates a package structure in accordance with some embodiments of the disclosure.

FIG. 5 schematically illustrates a package structure in accordance with some embodiments of the disclosure. A package structure 300 includes the semiconductor package 200 and a circuit board 370 (e.g., a printed circuit board) is illustrated. The semiconductor package 200 is disposed on and electrically connected to the circuit board 370 through the conductor terminals 130, such that the semiconductor component 120 in the semiconductor package 200 is electrically connected to the circuit board 370 through the wiring substrate 110 and the conductor terminals 130. In the embodiment, the semiconductor package 200 may be similar to that described in above, the same or similar reference numbers indicated in these embodiments may refer as similar or the same elements and the details of those elements may refer to the above descriptions and not reiterated here.

The conductor terminals 130 and the bottom stiffener 140 in the semiconductor package 200 are located between the wiring substrate 110 and the circuit board 370. The bottom stiffener 140 keeps a gap G140 from the circuit board 370. In other words, the bottom stiffener 140 is not in contact with the circuit board 370. Therefore, the disposition of the bottom stiffener 140 does not limit the contact between the conductor terminals 130 and the circuit board 370. The reliability of the physical and electrical connection between conductor terminals 130 and the circuit board 370 is ensured. In some embodiments, a further underfill 380 is formed between the wiring substrate 110 and the circuit board 370, and laterally encapsulates the conductor terminals 130 and the bottom stiffener 140.

Figure 6:
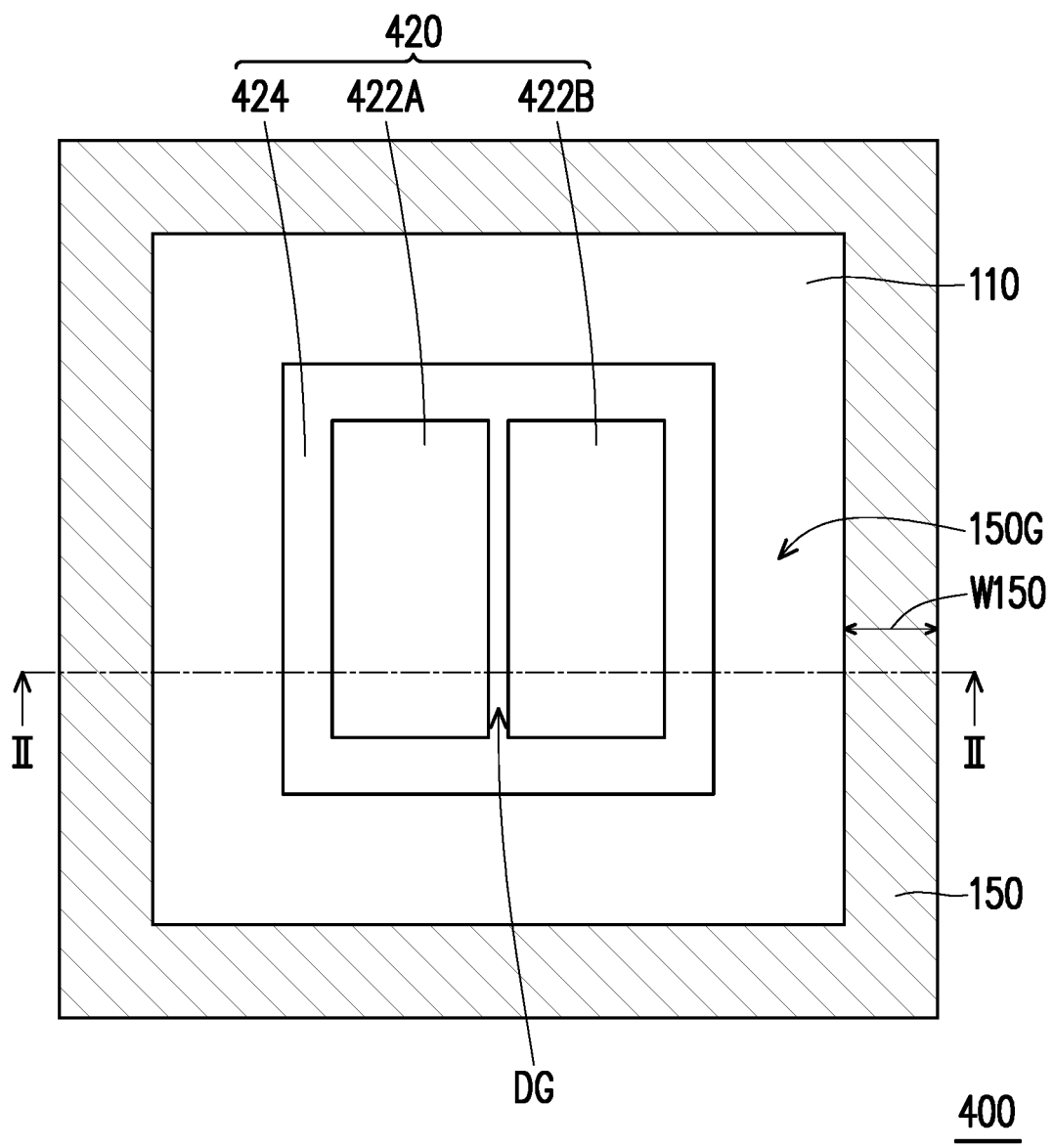
FIG. 6 schematically illustrates a top view of a semiconductor package in accordance of some embodiments of the disclosure.
Figure 7:
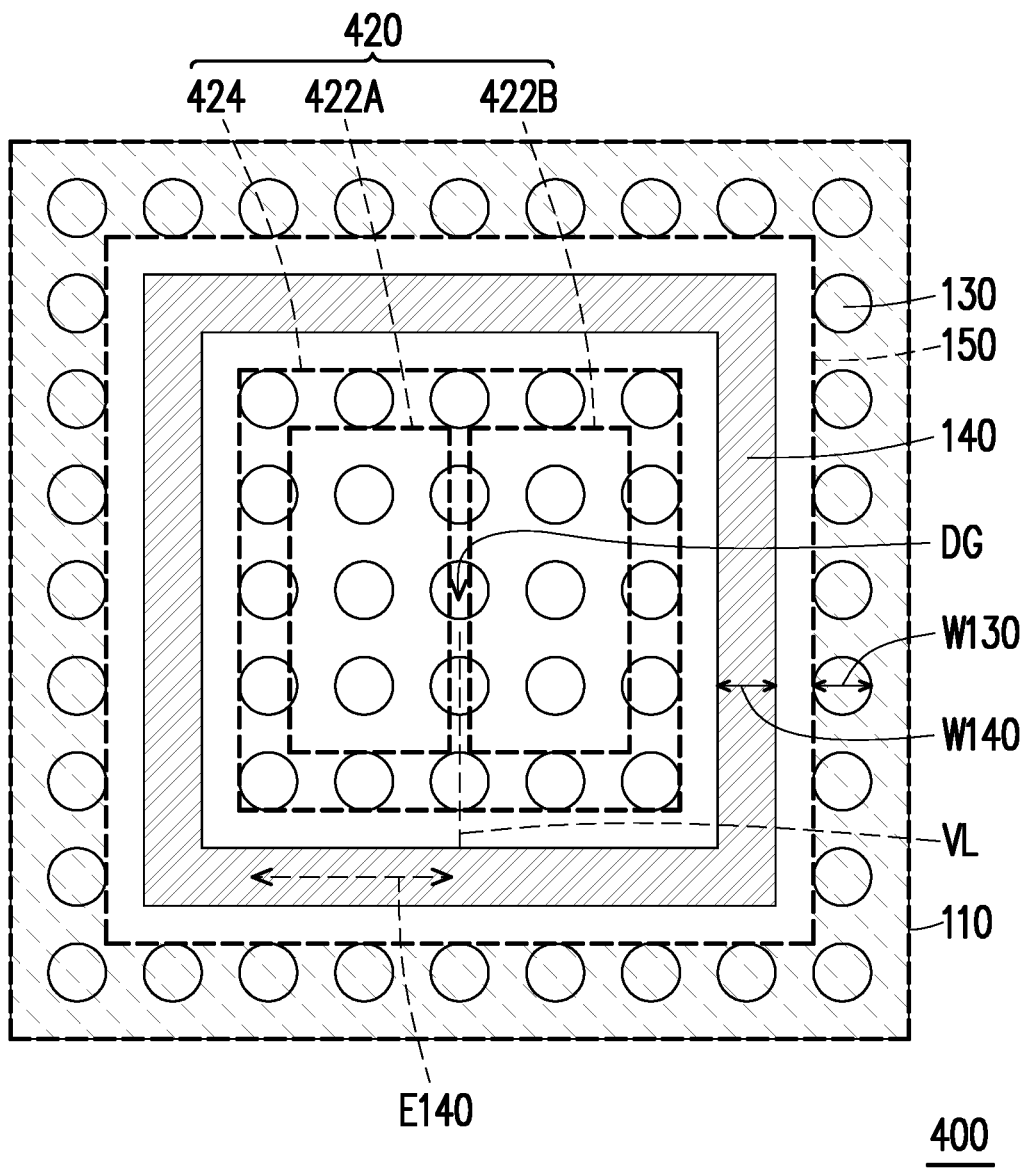
FIG. 7 schematically illustrates a bottom of a semiconductor package in accordance of some embodiments of the disclosure.

FIG. 6 and FIG. 7 schematically illustrate a top view and a bottom of a semiconductor package in accordance of some embodiments of the disclosure. Referring to FIGS. 6 and 7, a semiconductor package 400 includes a wiring substrate 110, a semiconductor component 420, conductor terminals 130, a bottom stiffener 140 and a top stiffener 150. The semiconductor package 400 shown in FIGS. 6 and 7 is substantially similar to the semiconductor package 100 shown in FIGS. 1 and 2, and the same and similar reference numbers depicted in these figures present the same or similar components. Specifically, the wiring substrate 110, as described in above, includes a dielectric core layer, build-up or laminated dielectric layers stacked over opposite surfaces of the dielectric core layer, conductive wiring layers embedded in the build-up or laminated dielectric layers, conductive vias penetrating through the dielectric core layer and the build-up or laminated dielectric layers. The semiconductor component 420 and the top stiffener 150 are disposed on and attached to the first, top surface of the wiring substrate 110 shown in FIG. 6 and the conductor terminals 130 and the bottom stiffener 140 are disposed on the second, bottom surface of the wiring substrate 110 shown in FIG. 7. In FIG. 7, the top stiffener 150 and the semiconductor component 420 are presented by using dash lines for illustration purpose though the semiconductor component 420 is actually disposed on the first surface of the wiring substrate 110.

In FIG. 6, the semiconductor component 420 includes two semiconductor dies 422A and 422B and a molding material 424 surrounding and encapsulating the semiconductor dies 422A and 422B. In some embodiments, the semiconductor component 420 may include one single semiconductor die or more that two semiconductor dies. The top stiffener 150 forms a ring-like shape surrounding the periphery of the semiconductor package 400. The outer edge of the top stiffener 150 may be substantially overlapped and aligned with the outer edge of the wiring substrate 110 so that FIG. 6 does not show the outer edge of the wiring substrate 110. The top stiffener 150 is spaced from the semiconductor component 420 by a gap 150G without overlapping the semiconductor component 420. In some embodiments, a width W150 of the top stiffener 150 may be 3 mm or more and the gap 150G may be smaller than the width W150.

In FIG. 7, the conductor terminals 130 are arranged in an array over the second, bottom surface of the wiring substrate 110 to form a ball grid array (BGA) and each of the conductor terminals 130 may include a eutectic material such as solder, although any suitable materials may alternatively be used. The bottom stiffener 140 is located between the conductor terminals 130. The bottom stiffener 140 has a ring-like shape surrounding an area where the semiconductor component 420 is, but the disclosure is not limited thereto. In some embodiments, the bottom stiffener 140 may have a linear shape, an L shape, a U shape, or other shapes and a quantity of the bottom stiffener 140 be multiple. A width W140 of the bottom stiffener 140 measured along a direction perpendicular to the elongation of the linear portion of the bottom stiffener 140 is proximate to a width W130 of the conductor terminals 130. In some embodiments, the width W140 of the bottom stiffener 140 may be not greater than 1 mm.

In some embodiments, the stress subjected by the wiring substrate 110 may be generated due to the CTE mismatch between the semiconductor dies 422A and 422B and the wiring substrate 110. For example, the semiconductor dies 422A and 422B may have a CTE of 3 ppm and the wiring substrate 110 may have an effective CTE of 14 ppm. In the case the semiconductor package 400 suffers a temperature change during operation or testing, certain stress would be generated due to such CTE mismatch between the semiconductor dies 422A and 422B and the wiring substrate 110. In the embodiment, the bottom stiffener 140 and the top stiffener 150 provide a reinforce effect to mitigate the warpage of the wiring substrate 110 to achieve a desired reliability and yield.

In the embodiment, a die gap DG is formed between the semiconductor dies 422A and 422B so as to laterally space the semiconductor dies 422A and 422B from each other and a virtual extension line VL of the die gap DG would intersect with the an elongation portion E140 of the bottom stiffener 140. The bottom stiffener 140 has lower CTE and higher Young's modulus than the wiring substrate 110. Therefore, the arrangement of the bottom stiffener 140 helps to prevent the warpage of the wiring substrate 110. Similarly, the top stiffener 150 also has suitable mechanic al property to prevent from the warpage of the wiring substrate 110. The semiconductor package 400 has improved yield and reliability since the bottom stiffener 140 and the top stiffener 150 reinforce the mechanical property of the wiring substrate 110. In some embodiments, the interesting of the virtual extension line VL and the elongation portion E140 may prevent from a warpage of the wiring substrate 110 bending about the virtual extension line VL.

Figure 8:
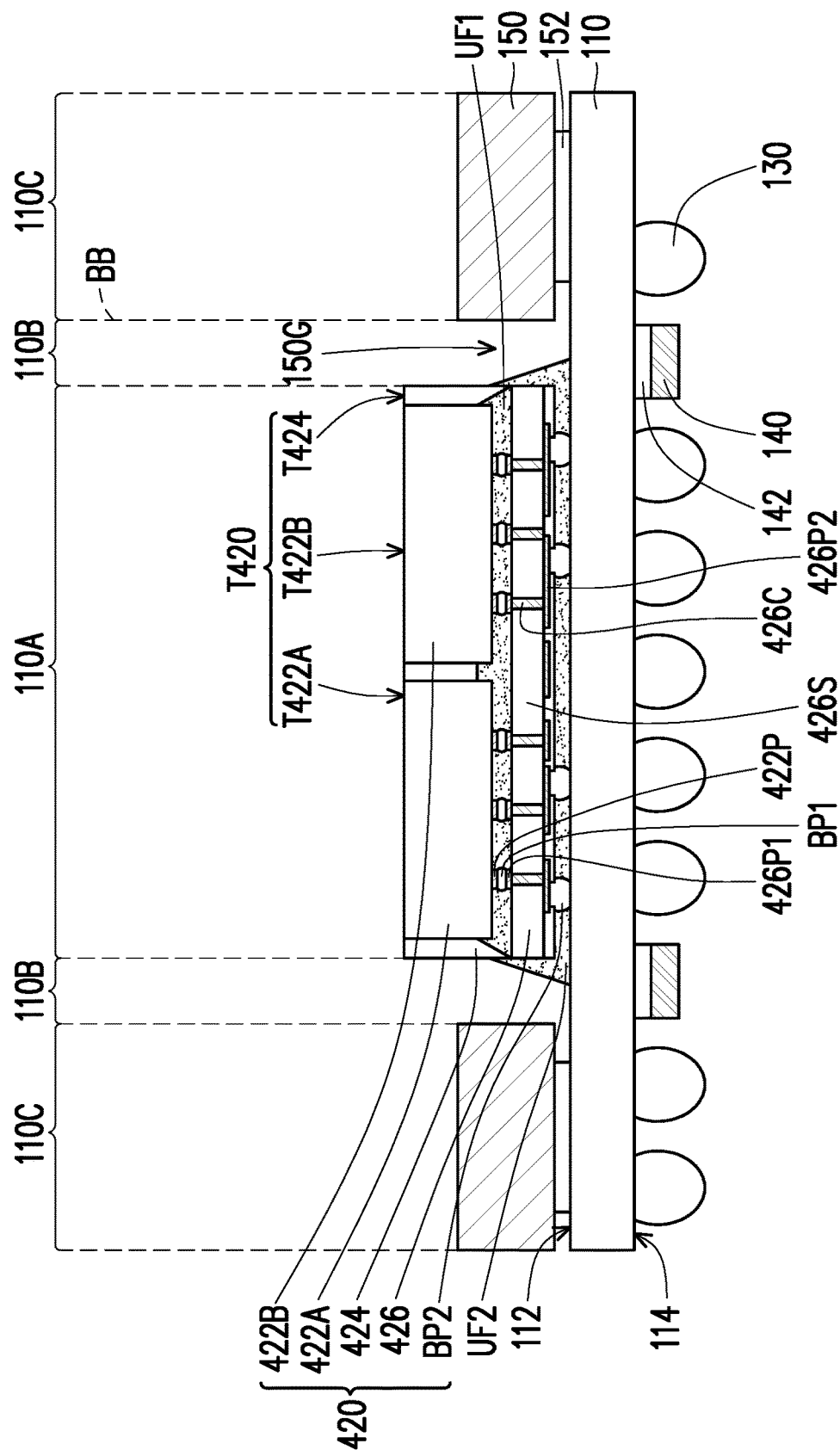
FIG. 8 schematically illustrates a cross sectional view of a semiconductor package taken along line II-II of FIG. 6.

FIG. 8 schematically illustrates a cross sectional view of a semiconductor package taken along line II-II of FIG. 6. The semiconductor package 400 as described in FIGS. 6 and 7 includes the wiring substrate 110, the semiconductor component 420, the conductor terminals 130, the bottom stiffener 140 and the top stiffener 150. The same or similar reference numbers indicated in FIGS. 6 to 8 refer to the same or similar elements and the descriptions for FIGS. 6 and 7 may be incorporated in the embodiment of FIG. 8. The wiring substrate 110 has a first surface 112 and a second surface 114 opposite to the first surface 112. The semiconductor component 420 and the top stiffener 150 are disposed on the first surface 112 of the wiring substrate 110. The conductor terminals 130 and the bottom stiffener 140 are disposed on the second surface 114 of the wiring substrate 110.

The wiring substrate 110 includes a dielectric core layer, build-up or laminated dielectric layers stacked over opposite surfaces of the dielectric core layer, conductive wiring layers embedded in the build-up or laminated dielectric layers, conductive vias penetrating through the dielectric core layer and the build-up or laminated dielectric layers. The semiconductor component 420 is mounted on the first surface 112 of the wiring substrate 110 through a wafer-level bumping process and is electrically connected to the wiring substrate 110. The conductor terminals 130 are formed on the second surface 114 of the wiring substrate 110. The top stiffener 150 is adhered onto the first surface 112 of the wiring substrate 110. The bottom stiffener 140 is adhered onto the second surface 114 of the wiring substrate 110.

The semiconductor component 420 may include two semiconductor dies 422A and 422B, a molding material 424 laterally surrounding and encapsulating the semiconductor dies 422A and 422B, and at least one interposer 426 carrying the semiconductor dies 422A and 422B. Each of the semiconductor dies 422A and 422B has electrical circuitry formed therein and may include electrical components, contact structures and wirings for electrically connecting the electrical components to form required electrical circuitry. For example, the electrical components may include various N-type metal-oxide semiconductor (NMOS) and/or P-type metal-oxide semiconductor (PMOS) devices, such as transistors, capacitors, resistors, diodes, photo-diodes, fuses, and/or the like, interconnected to perform one or more functions, wherein the functions may include memory structures, processing structures, sensors, amplifiers, power distribution, input/output circuitry, or the like. The above examples are provided for illustrative purposes only to further explain applications of some illustrative embodiments and are not meant to limit the disclosure. The semiconductor component 420 is oriented that the active surfaces of the semiconductor dies 422A and 422B face the wiring substrate 110. In some embodiments, one of the semiconductor dies 422A and 422B includes logic dies, System-on-Chip (SoC) dies or other suitable semiconductor dies, and the other of the semiconductor dies 422A and 422B includes High Bandwidth Memory (HBM) cubes each having stacked memory dies or other suitable semiconductor dies.

The interposer 426 may be a silicon interposer wafer including multiple silicon interposers or other suitable semiconductor interposer wafer. The interposer 426 may include a substrate 426S, and conductor structures 426C forming electric transmission paths penetrating through the substrate 426S. First bump pads 426P1 are disposed on an upper surface of the substrate 426S, second bump pads 426P2 are disposed on a lower surface of the substrate 426S, and the first bump pads 426P1 are electrically connected to the corresponding second bump pads 426P2 through the conductor structures 426C. In some embodiments, the conductor structures 426C may include at least one through via that extends from the upper surface of the substrate 426S to the lower surface of the substrate 426S.

The semiconductor dies 422A and 422B are connected to the interposer 426 through conductive bumps BP1. Specifically, the semiconductor dies 422A and 422B are formed with bump pads 422P and the conductive bumps BP1 are disposed between the first bump pads 426P1 on the interposer 426 and the bump pads 422P on the semiconductor dies 422A and 422B. The conductive bumps BP1 may be formed through a wafer-level bumping process. In some embodiments, the conductive bumps BP1 include micro bumps. The conductive bumps BP1 may each include a copper (Cu) pillar covered by a nickel (Ni) cap, and the nickel (Ni) cap may be electrically connected to the first bump pads 426P1 through solder material. For example, the solder material includes Sn—Ag solder material or other suitable solder material.

An underfill UF1 is formed over the interposer 426 to fill gaps between the semiconductor die 422A and the interposer 426 as well as gaps between the semiconductor die 422B and the interposer 426. The underfill UF1 laterally encapsulates the conductive bumps BP1 so that the conductive bumps BP1 are sealed by the underfill UF1. The underfill UF1 is made of dielectric material without electrical connecting to the conductive bumps BP1. The material of the underfill UF1 includes polymer composite material, such as epoxy resin with filler, epoxy acrylate with filler, or polymer with proper filler.

The molding material 424 is disposed on the interposer 426 and laterally encapsulates the underfill UF1 and the semiconductor dies 422A and 422B. The top surface T422A of the semiconductor die 422A, the top surface T422B of the semiconductor die 422B, and the top surface T424 of the molding material 424 are leveled with each other to define the top surface T420 of the semiconductor component 420. The molding material 424 may be formed by an over-molding process or a deposition process followed by a removal process to form the top surface T420. In some embodiments, an insulating material such as epoxy resin is formed on the interposer 426 to cover the back surfaces and sidewalls of the semiconductor dies 422A and 422B through an over-molding process, and a grinding process, a chemical mechanic al polishing (CMP) process or other suitable removal process is then performed to remove portions of the epoxy resin until the semiconductor dies 422A and 422B are revealed without damaging the circuit elements formed in the semiconductor dies 422A and 422B. In some alternative embodiments, an insulating material such as tetraethoxysilane (TEOS) formed oxide is formed on the interposer 426 to cover back surfaces and sidewalls of the semiconductor dies 422A and 422B through a chemical vapor deposition (CVD) process, and a grinding process, a CMP process or other suitable removal process is then performed to remove portions of the TEOS formed oxide until the semiconductor dies 422A and 422B are revealed. without damaging the circuit elements formed in the semiconductor dies 422A and 422B Accordingly, the top surface T422A of the semiconductor die 422A, the top surface T422B of the semiconductor die 422B, and the top surface T424 of the molding material 424 are leveled with each other to construct the top surface T420 of the semiconductor component 420.

Conductive bumps BP2 are formed on the second bump pads 426P2 of the interposer 426. The semiconductor component 420 is mounted onto the first surface 112 of the wiring substrate 110 through the conductive bumps BP2 by performing a wafer-level bumping process. In other words, the conductive bumps BP2 may be formed by performing wafer-level bumping process. The conductive bumps BP2 include micro bumps. The conductive bumps BP2 may each include a copper (Cu) pillar covered by a nickel (Ni) cap, and the nickel (Ni) cap may be electrically connected to the pads on the wiring substrate 110 through solder material. For example, the solder material includes Sn—Ag solder material or other suitable solder material.

An underfill UF2 is further disposed between the interposer 426 and the wiring substrate 110 to fill gaps between the conductive bumps BP2. The underfill UF2 laterally encapsulates the conductive bumps BP2 so that the conductive bumps BP2 are sealed by the underfill UF2. The underfill UF2 is made of dielectric material without electrical connecting to the conductive bumps BP2. The material of the underfill UF2 includes polymer composite material, such as epoxy resin with filler, epoxy acrylate with filler, or polymer with proper filler. The semiconductor package 400 including the wiring substrate 110 and the singulated structure of the semiconductor dies 422A and 422B disposed on the interposer 426 may be a Chip-on-Wafer-on-Substrate (CoWoS) package.

The bottom stiffener 140 is adhered onto the second surface 114 of the wiring substrate 110 through an adhesive 142 and the top stiffener 150 is adhered onto the first surface 112 of the wiring substrate 110 through an adhesive 152. In some embodiments, the material of the adhesive 142 may be the same as the adhesive 152. The bottom stiffener 140 has a Young modulus higher than 100 Gpa and a CTE lower than 10 ppm. A material of the bottom stiffener 140 includes, for example, silicon, silicon carbide, tungsten, tungsten carbide, etc. The top stiffener 150 has desirable mechanical properties such as good thermal conductivity and may be made of a material of copper, stainless steel, steel, metal alloy, or the like so as to provide a heat dissipation effect.

As shown in FIGS. 6 to 8, the top stiffener 150 keeps a gap 150G from the semiconductor component 420. The bottom stiffener 140 extends along the periphery of the semiconductor component 420 and may be partially overlapped with the semiconductor component 420. In some embodiments, the bottom stiffener 140 may not overlap the top stiffener 150. The arrangements of the bottom stiffener 140 and the top stiffener 150 help to prevent the wiring substrate 110 from warpage caused by the stress due to the CTE mismatch between the semiconductor dies 422A and 422B and the wiring substrate 110 so as to improve reliability of the semiconductor package 400 and achieve desired yield.

Figure 9:
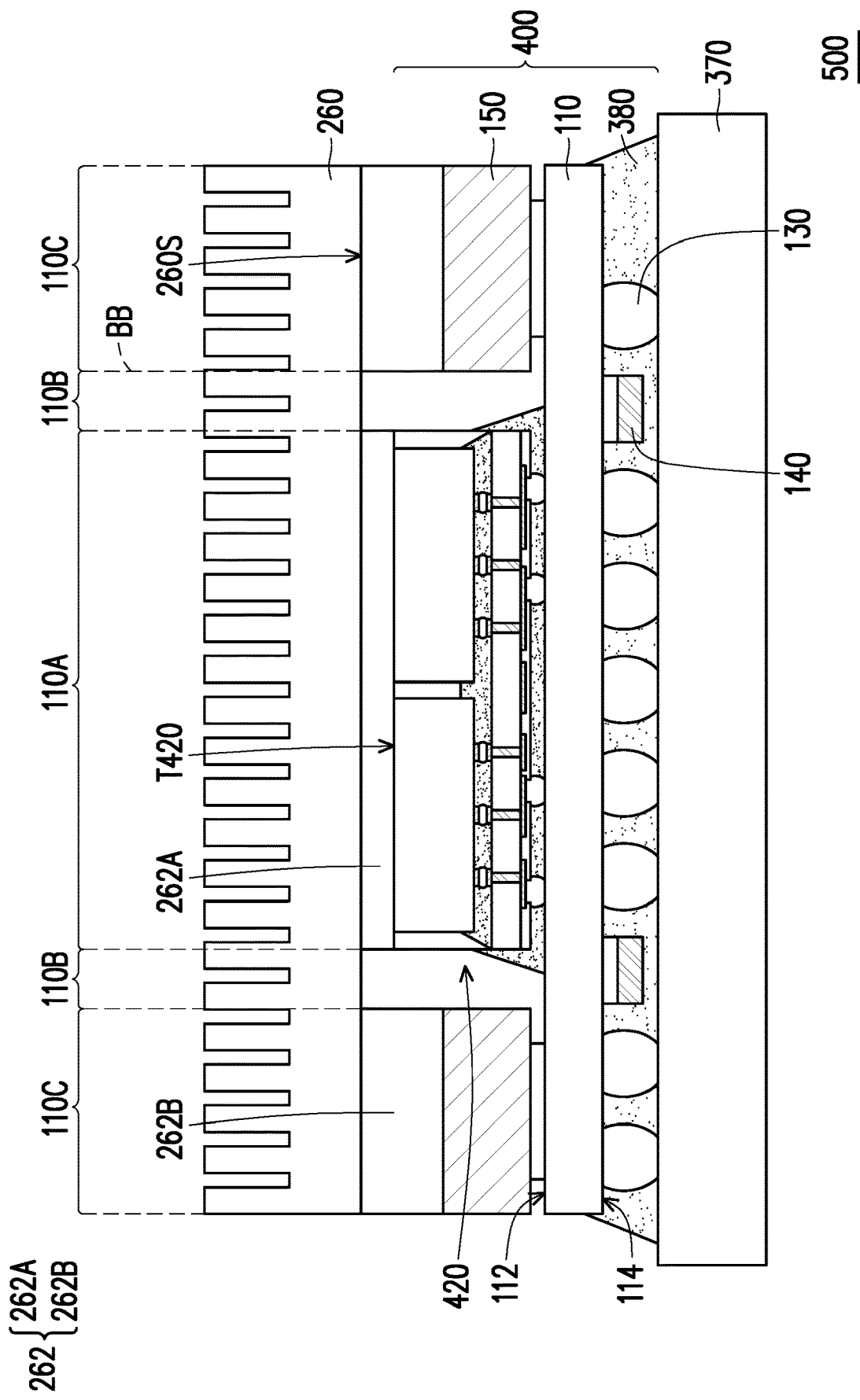
FIG. 9 schematically illustrates a package structure in accordance with some embodiments of the disclosure.

The semiconductor package 400 may be combined with a heat sink and may be bonded to a circuit board as shown in FIG. 9. A package structure 500 may include the semiconductor package 400 depicted in FIGS. 6 to 8, a heat sink 260 and a circuit board 370. The heat sink 260 is attached to the semiconductor package 400 through the thermal interface material 262. The thermal interface material 262 includes a portion 262A formed on the top surface T420 of the semiconductor component 420 of the semiconductor package 400 and a portion 262B formed on the top stiffener 150. The coupling surface S260 of the heat sink 260 facing the wiring substrate 110 may keep a constant distance from the wiring substrate 110 at the region where the semiconductor component 420 is and the region where the top stiffener 150 is. In other words, the coupling surface S260 of the heat sink 260 is a planar surface without a staggered structure. The semiconductor package 400 is disposed on and electrically connected to the circuit board 370 through the conductor terminals 130. The circuit board 370 includes dielectric layers and conductor metal layer between the dielectric layers. The bottom stiffener 140 may keep a distance from the circuit board 370 without contacting with the circuit board, which helps to ensure the bonding reliability between the conductor terminals 130 and the circuit board 370. In addition, a further underfill 380 is formed between the wiring substrate 110 and the circuit board 370, and laterally encapsulates the conductor terminals 130 and the bottom stiffener 140.

Figure 10:
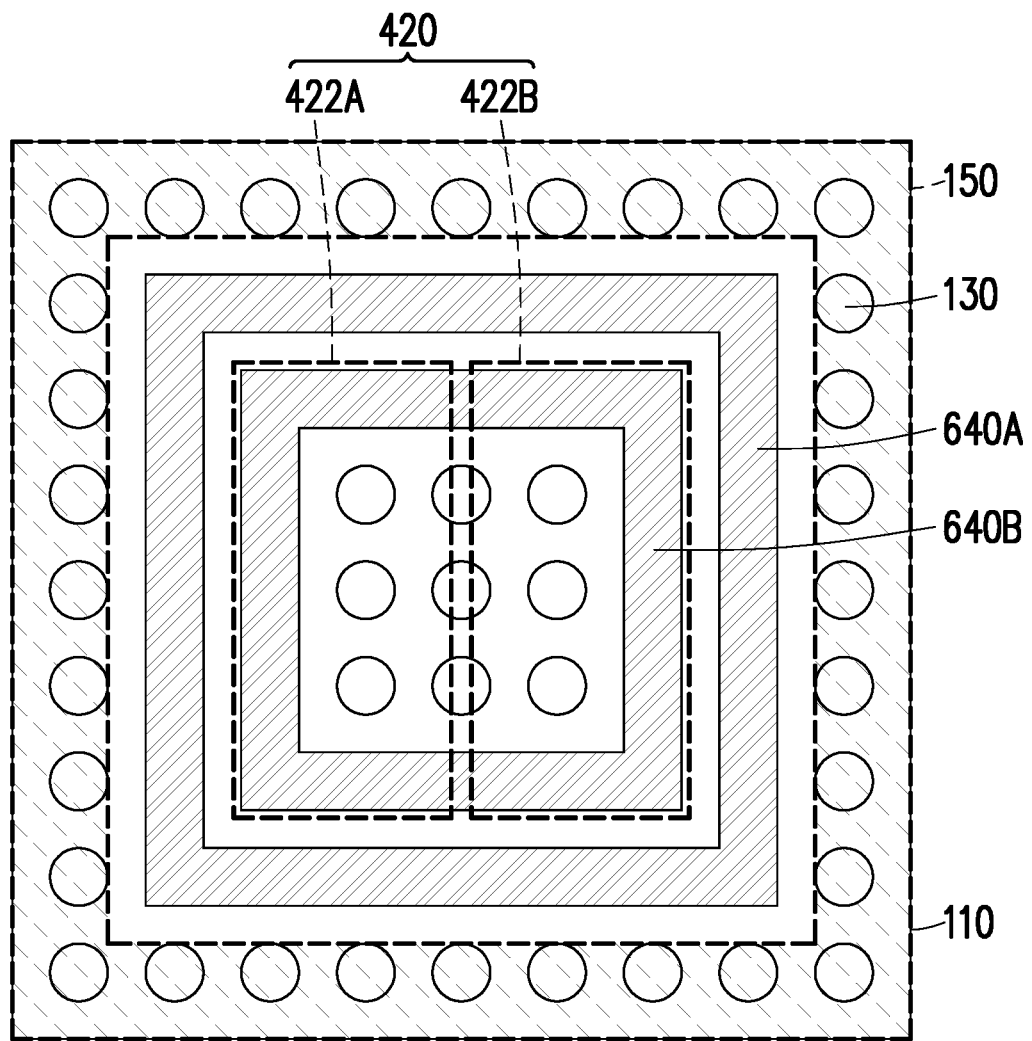
FIG. 10 schematically illustrates a bottom view of a semiconductor package in accordance with some embodiments.

FIG. 10 schematically illustrates a bottom view of a semiconductor package in accordance with some embodiments. For illustration purpose, FIG. 10 though presents the bottom view of the semiconductor package, also shows the elements of the semiconductor package that is disposed on the top surface of the semiconductor package by using dash lines. A semiconductor package 600 includes a wiring substrate 110, a semiconductor component 420, conductor bumps 130, bottom stiffeners 640A and 640B, and a top stiffener 150. The structure, the disposition, the material and the property of each of the wiring substrate 110, the semiconductor component 420, the conductor terminals 130 and the top stiffener 150 may refer to the description in the above embodiment of FIGS. 6 to 8. Specifically, the semiconductor package 600 may be modified from the semiconductor package 400 by disposing multiple bottom stiffener 640A and 640B on the wiring substrate 110. Therefore, the same elements in the semiconductor package 400 and the semiconductor package 600 are not reiterated here.

The bottom stiffener 640A may be arranged in a manner similar to the bottom stiffener 140 described in the previous embodiment. The bottom stiffener 640A has a ring-like shape that surrounds the semiconductor component 420 having multiple semiconductor dies 422A and 422B. The bottom stiffener 640A forms a ring-like shape. The bottom stiffener 640B is located within the area circled by the bottom stiffener 640A. The bottom stiffener 640B may be completely located within the projection area of the semiconductor component 420 on the wiring substrate 110. The material of the bottom stiffener 640A and the bottom stiffener 640B may be the same or different. Both the bottom stiffener 640A and the bottom stiffener 640B have a CTE smaller than 10 ppm and a Young's modulus greater than 100 Gpa. A material for the bottom stiffeners 640A and 640B may be selected from at least one of silicon, silicon carbide, tungsten, tungsten carbide, etc. The bottom stiffener 640A and the bottom stiffener 640B form a dual ring pattern, but the disclosure is not limited thereto. In some embodiments, one or both of the bottom stiffener 640A and the bottom stiffener 640B may have linear shape, diamond shape, other polygonal shape, cross shape, or the like. In some embodiments, the semiconductor package 600 may have more bottom stiffeners.

Figure 11:
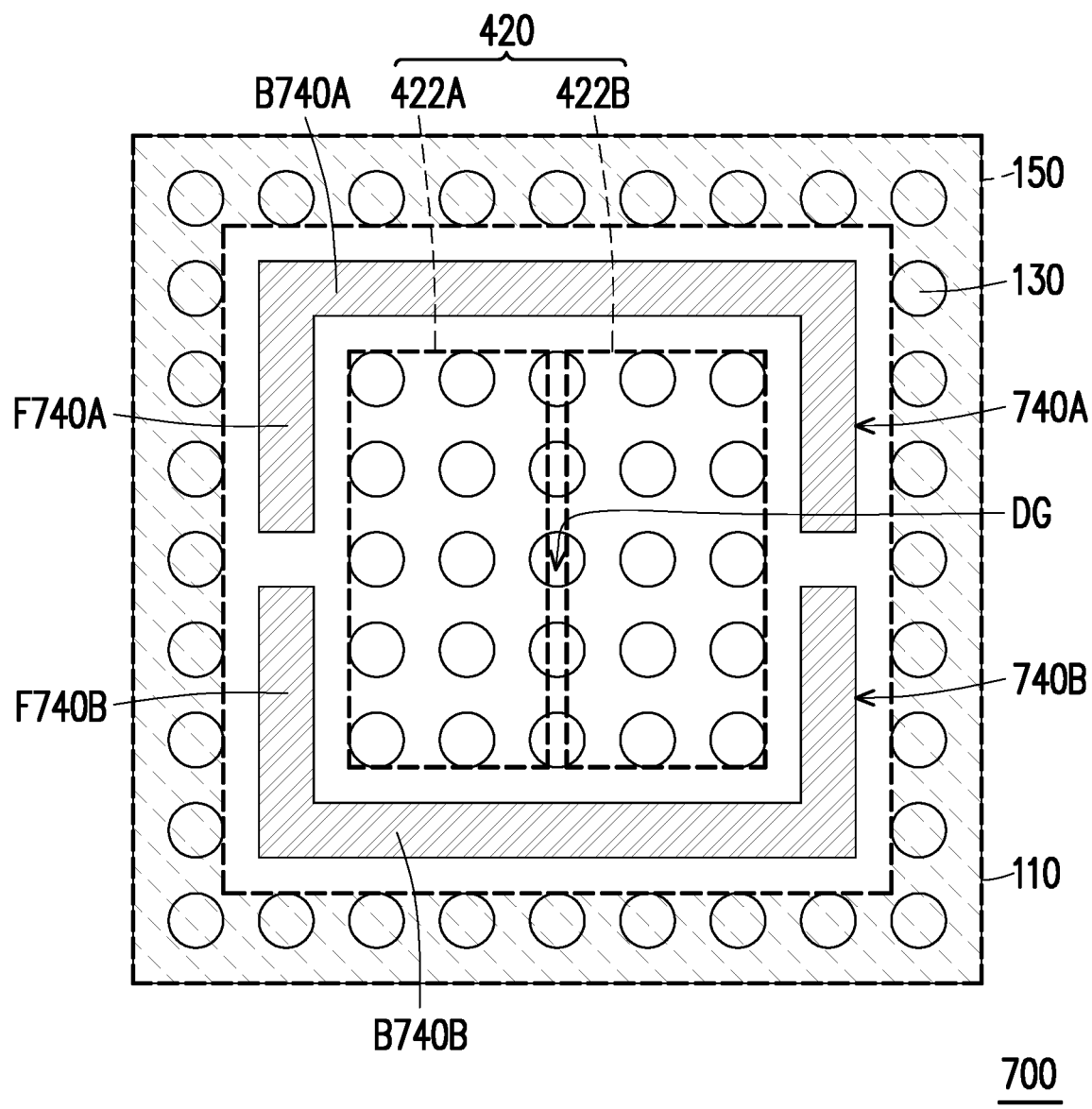
FIG. 11 schematically illustrates a bottom view of a semiconductor package in accordance with some embodiments.

FIG. 11 schematically illustrates a bottom view of a semiconductor package in accordance with some embodiments. A semiconductor package 700 is similar to the semiconductor package 400 described in the above embodiment of FIGS. 6 to 8. Specifically, the semiconductor package 700 may be modified from the semiconductor package 400 by replacing the bottom stiffener 140 with multiple bottom stiffeners 740A and 740B. Therefore, the same elements in the semiconductor package 400 and the semiconductor package 700 are not reiterated here. The bottom stiffener 740A includes a bar portion B740A and two finger portion F740A connected to two opposite terminal of the bar portion B740A. Similarly, the bottom stiffener 740B includes a bar portion B740B and two finger portions F740B connected to two opposite terminal of the bar portion B740B. Accordingly, the bottom stiffener 740A and the bottom stiffener 740B each has a U-like shape and the U-like shape of the bottom stiffener 740A and the U-like shape of the bottom stiffener 740B are arranged opposite to each other to surround the semiconductor component 420. In some embodiments, one or both of the bottom stiffener 740A and the bottom stiffener 740B may include more finger portions or only one single finger portion. In some embodiments, the finger portions of the bottom stiffener 740A may be connected to the finger portions of the bottom stiffener 740B.

The semiconductor component 420 has semiconductor dies 422A and 422B that are separated from each other by a die gap DG. The elongation of the bar portions B740A and B740B may intersect with a virtual extension line of the die gap DG. Accordingly, the warpage of the wiring substrate 110 bending about the virtual extension line of the die gap DG may be prevented by the reinforcement of the bottom stiffeners 740A and 740B.

Figure 12:
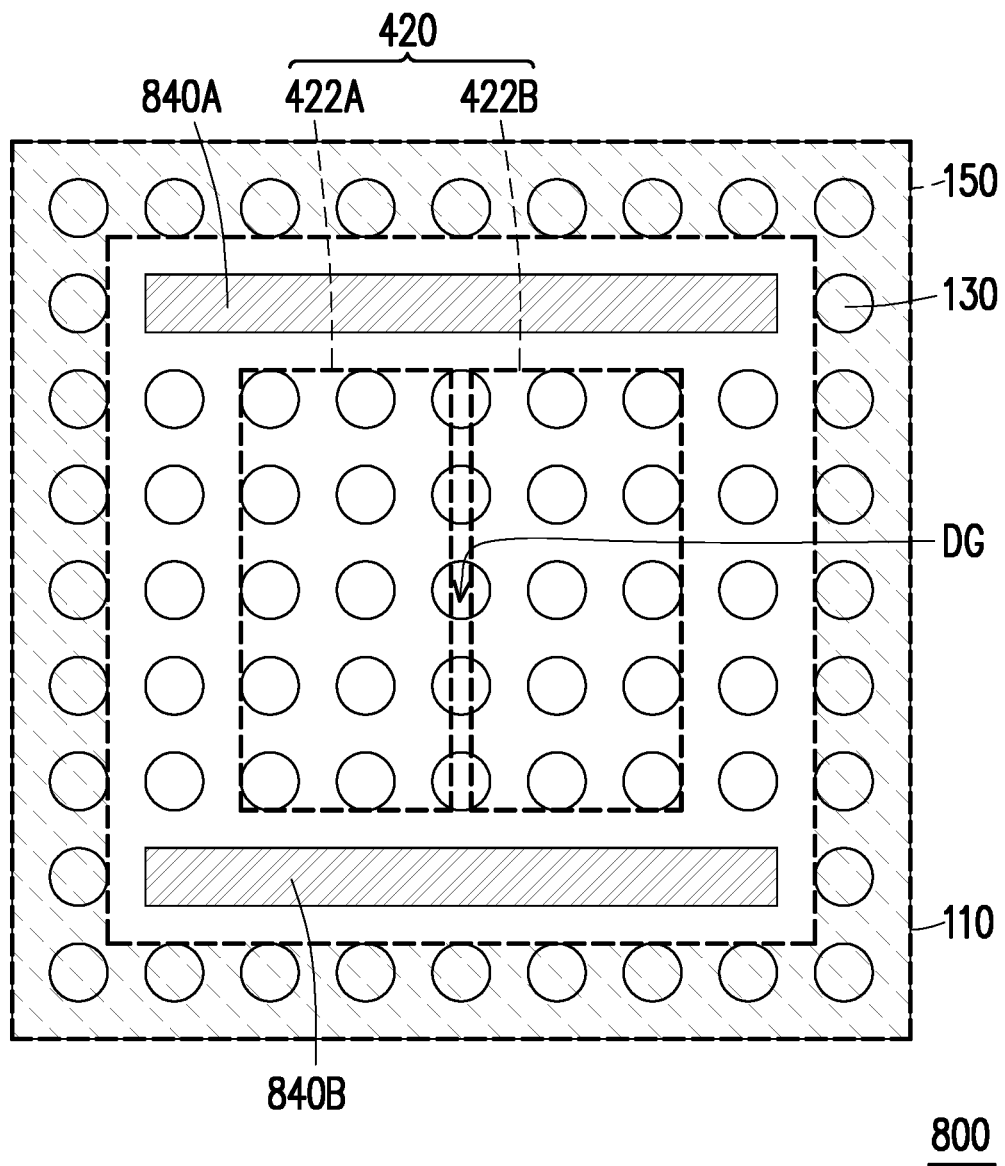
FIG. 12 schematically illustrates a bottom view of a semiconductor package in accordance with some embodiments.

FIG. 12 schematically illustrates a bottom view of a semiconductor package in accordance with some embodiments. A semiconductor package 800 is similar to the semiconductor package 700 described in the above embodiment of FIG. 11. Specifically, the semiconductor package 800 may be modified from the semiconductor package 700 by changing the shapes of the bottom stiffeners 840A and 840B. Therefore, the same elements in the semiconductor package 700 and the semiconductor package 800 are not reiterated here. The bottom stiffener 840A and the bottom stiffener 840B both have a bar-like shape. The semiconductor component 420 has semiconductor dies 422A and 422B that are separated from each other by a die gap DG. The elongations of the bar-like shape of the bottom stiffener 840A and the bar-like shape of the bottom stiffener 840B may intersect with a virtual extension line of the die gap DG. Accordingly, the warpage of the wiring substrate 110 bending about the virtual extension line of the die gap DG may be prevented by the reinforcement of the bottom stiffeners 840A and 840B. In some embodiments, the quantity of the bottom stiffeners 840A and 840B may be one, or more than two. In some embodiments, the bar-like shaped bottom stiffeners may not be parallel to each other.

Figure 13:
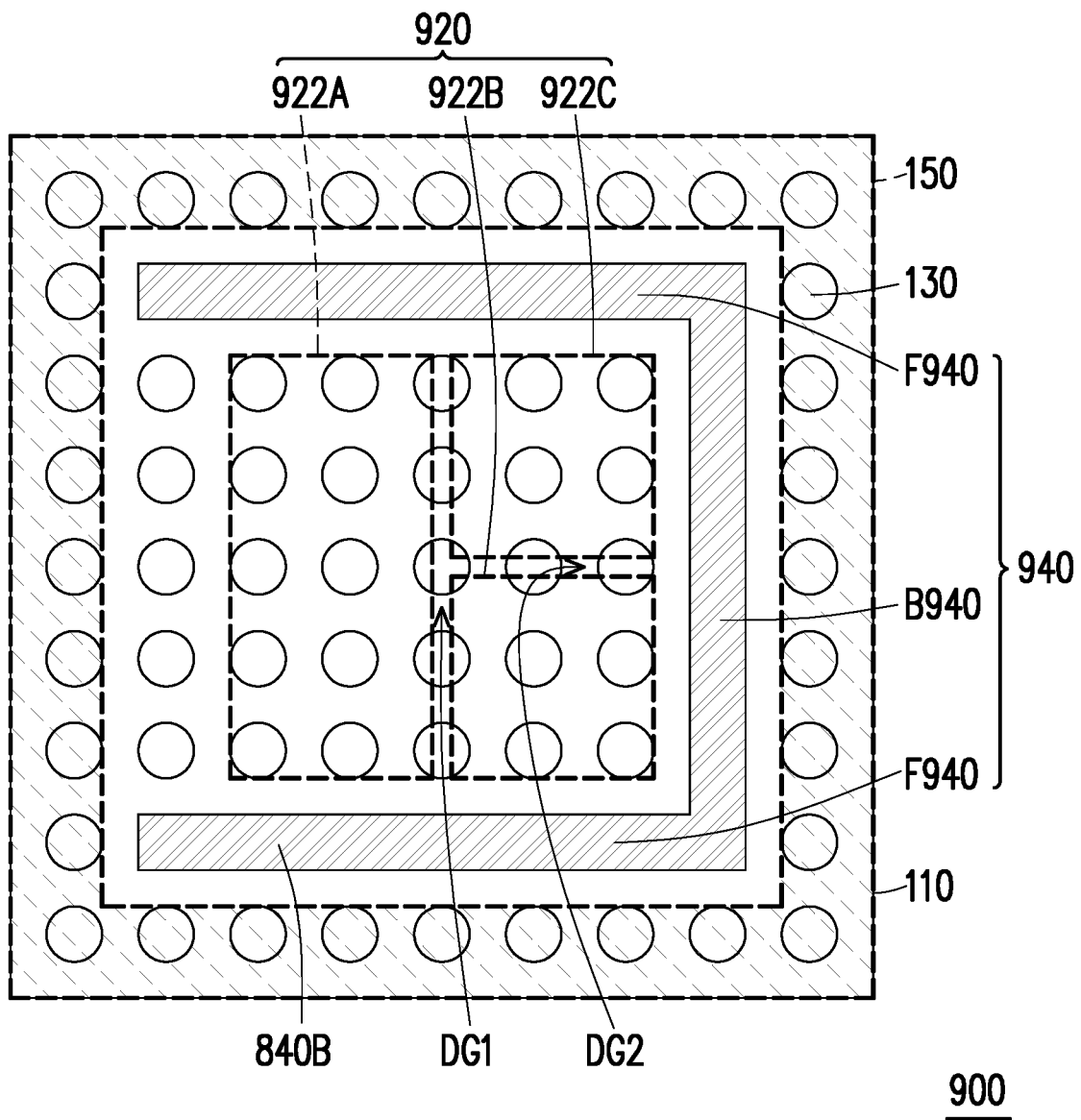
FIG. 13 schematically illustrates a bottom view of a semiconductor package in accordance with some embodiments.

FIG. 13 schematically illustrates a bottom view of a semiconductor package in accordance with some embodiments. A semiconductor package 900 includes a wiring substrate 110, a semiconductor component 920, conductor terminals 130, and a bottom stiffener 940 and is similar to the semiconductor package 400 described in the above embodiment of FIGS. 6 to 8. Specifically, the semiconductor package 900 may be modified from the semiconductor package 400 by changing the numbers of the semiconductor dies and changing the shape of the bottom stiffener. Therefore, the same elements in the semiconductor package 400 and the semiconductor package 900 are not reiterated here.

In the embodiment, the semiconductor component 920 includes three semiconductor dies 922A, 922B and 922C. A die gap DG1 separates the semiconductor die 922A from the semiconductor die 922B and the semiconductor die 922C and a die gap DG2 separates the semiconductor die 922B from the semiconductor die 922C. The die gap DG1 and the die gap DG2 extends along different direction and are connected to each other. The die gap DG1 and the die gap DG2 may form a T-like shaped gap, but the disclosure is not limited thereto. The bottom stiffener 940 has a U-like shape and includes a bar portion B940 and two finger portions F940 connected to two opposite terminal of the bar portion B940. The elongations of the finger portions F940 may intersect with a virtual extension line of the die gap DG1 and the elongation of the bar portion B940 may intersect with a virtual extension line of the die gap DG2.

The semiconductor package in accordance with some embodiments includes a bottom stiffener disposed on the bottom side of the semiconductor package where the conductor terminals are disposed. The bottom stiffener has low CTE and high Yong modulus so as to enhance the mechanical property of the semiconductor package. The semiconductor package has improved reliability under the reinforcement of the bottom stiffener. In some embodiments, the bottom stiffener is shorter than the conductor terminals in the thickness direction so that the connection of the conductor terminals to an external device such as a circuit board is ensured without blocking by the bottom stiffener.

In accordance with some embodiments of the disclosure, a semiconductor package includes a wiring substrate, a semiconductor component, conductor terminals, a bottom stiffener and a top stiffener. The wiring substrate has a first surface and a second surface opposite to the first surface. The semiconductor component is disposed on the first surface of the wiring substrate. The conductor terminals are disposed on the second surface of the wiring substrate and electrically connected to the semiconductor component through the wiring substrate. The bottom stiffener is disposed on the second surface of the wiring substrate and positioned between the conductor terminals. The top stiffener is disposed on the first surface of the wiring substrate. The top stiffener is laterally spaced further away from the semiconductor component than the bottom stiffener. In some embodiments, the bottom stiffener partially overlaps the semiconductor component. In some embodiments, the top stiffener keeps a gap from the semiconductor component and the bottom stiffener is positioned overlapping the gap. In some embodiments, the semiconductor component includes semiconductor dies with a die gap between each other and a virtual extension line of the die gap intersects with an elongation of the bottom stiffener. In some embodiments, a material of the bottom stiffener is different from a material of the top stiffener. In some embodiments, a distal surface of the bottom stiffener away from the wiring substrate is leveled between the wiring substrate and a distal surface of one conductor terminal away from the wiring substrate. In some embodiments, a top surface of the top stiffener is leveled between the wiring substrate and a top surface of the semiconductor component away from the wiring substrate.

In accordance with some other embodiments of the disclosure, a semiconductor package includes a wiring substrate, a semiconductor component, a bottom stiffener, and a top stiffener. The wiring substrate has a center region, a first peripheral region and a second peripheral region, wherein the first peripheral region surrounds the center region and the second peripheral region surrounds the first peripheral region. The semiconductor component is disposed on the wiring substrate at the center region. The bottom stiffener is disposed on the wiring substrate between the semiconductor component and a boundary between the first peripheral region and the second peripheral region. The top stiffener is disposed on the wiring substrate away from the semiconductor component from the boundary between the first peripheral region and the second peripheral region. In some embodiments, the semiconductor component and the top stiffener are disposed at a first surface of the wiring substrate, and the bottom stiffener is disposed at a second, opposite surface of the wiring substrate. In some embodiments, the bottom stiffener is adhered onto the wiring substrate. In some embodiments, a heat sink is further attached onto the semiconductor component. In some embodiments, the heat sink has a planer coupling surface attaching to the semiconductor component. In some embodiments, the heat sink is attached to the semiconductor component through a thermal interface material. In some embodiments, a conductor terminal is further disposed on the wiring substrate beside the bottom stiffener, wherein a distal surface of the bottom stiffener away from the wiring substrate is leveled between the wiring substrate and a distal surface of one conductor terminal away from the wiring substrate. In some embodiments, a width of the bottom stiffener is smaller than a width of the top stiffener. In some embodiments, a coefficient of thermal expansion of the bottom stiffener is lower than an effective coefficient of thermal expansion of the wiring substrate.

In accordance with some other embodiments of the disclosure, a semiconductor package includes a wiring substrate, a semiconductor component, conductor terminals, and a bottom stiffener. The wiring substrate has a first surface and a second, opposite, surface. The semiconductor component is disposed on the first surface of the wiring substrate. The conductor terminals are disposed on the second surface of the wiring substrate and electrically connected to the semiconductor component through the wiring substrate. The bottom stiffener is disposed on the second surface of the wiring substrate and positioned between the conductor terminals, wherein a distal surface of the bottom stiffener away from the wiring substrate is leveled between the wiring substrate and a distal surface of one conductor terminal away from the wiring substrate. In some embodiments, the bottom stiffener overlaps the semiconductor component and a coefficient of thermal expansion of the bottom stiffener is lower than an effective thermal expansion coefficient of the wiring substrate. In some embodiments, a top stiffener is further disposed on the first surface of the wiring substrate, wherein a top surface of the top stiffener is leveled between the wiring substrate and a top surface of the semiconductor component away from the wiring substrate. In some embodiments, the bottom stiffener extends along a periphery of the semiconductor component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a wiring substrate having a first surface and a second surface opposite to the first surface;
a semiconductor component disposed on the first surface of the wiring substrate;
conductor terminals disposed on the second surface of the wiring substrate; and
a bottom stiffener disposed on the second surface of the wiring substrate, wherein a lateral size of the bottom stiffener is smaller than a pitch of the conductor terminals.

2. The semiconductor package of claim 1, wherein the semiconductor component comprises semiconductor dies laterally spaced from each other by a die gap.

3. The semiconductor package of claim 1, further comprising a top stiffener disposed on the wiring substrate, wherein the top stiffener keeps a gap from the semiconductor component and the bottom stiffener is positioned overlapping the gap.

4. The semiconductor package of claim 3, wherein a material of the bottom stiffener is different from a material of the top stiffener.

5. The semiconductor package of claim 3, wherein a top surface of the top stiffener is leveled between the wiring substrate and a top surface of the semiconductor component away from the wiring substrate.

6. The semiconductor package of claim 1, wherein a distal surface of the bottom stiffener away from the wiring substrate is leveled between the wiring substrate and a distal surface of one conductor terminal away from the wiring substrate.

7. The semiconductor package of claim 1, wherein the lateral size of the bottom stiffener is proximate to one of the conductor terminals.

8. A semiconductor package, comprising:
a wiring substrate having a center region, a first peripheral region and a second peripheral region, wherein the first peripheral region surrounds the center region and the second peripheral region surrounds the first peripheral region,
a semiconductor component disposed on the wiring substrate at the center region;
a top stiffener disposed on the wiring substrate and arranged within the second peripheral region; and
a bottom stiffener disposed on the wiring substrate between the semiconductor component and a boundary between the first peripheral region and the second peripheral region, wherein a lateral size of the top stiffener is more than twice of a lateral size of the bottom stiffener.

9. The semiconductor package of claim 8, wherein the top stiffener is disposed at a first surface of the wiring substrate, and the bottom stiffener is disposed at a second, opposite surface of the wiring substrate.

10. The semiconductor package of claim 8, wherein the bottom stiffener is arranged along a ring-like path.

11. The semiconductor package of claim 8, further comprising a heat sink attached onto the semiconductor component through a thermal interface material.

12. The semiconductor package of claim 11, wherein the heat sink has a planer coupling surface attaching to the semiconductor component.

13. The semiconductor package of claim 8, wherein a material of the bottom stiffener is different from a material of the top stiffener.

14. The semiconductor package of claim 8, further comprising a conductor terminal disposed on the wiring substrate beside the bottom stiffener, wherein a distal surface of the bottom stiffener away from the wiring substrate is leveled between the wiring substrate and a distal surface of one conductor terminal away from the wiring substrate.

15. The semiconductor package of claim 8, wherein the semiconductor component comprises semiconductor dies arranged with a die gap between each other.

16. The semiconductor package of claim 8, wherein a coefficient of thermal expansion of the bottom stiffener is lower than an effective coefficient of thermal expansion of the wiring substrate.

17. A semiconductor package, comprising:
a wiring substrate having a first surface and a second, opposite, surface;
a semiconductor component disposed on the first surface of the wiring substrate and comprising semiconductor dies laterally spaced from each other by a die gap;
conductor terminals disposed on the second surface of the wiring substrate and electrically connected to the semiconductor component through the wiring substrate; and
a bottom stiffener disposed on the second surface of the wiring substrate and positioned between the conductor terminals, wherein in a width direction, two of the conductor terminals located at opposite sides of the bottom stiffener are spaced by a first pitch, two of the conductor terminals located at a common side of the bottom stiffener are spaced by a second pitch, and the first pitch is substantially twice of the second pitch.

18. The semiconductor package of claim 17, wherein a coefficient of thermal expansion of the bottom stiffener is lower than an effective thermal expansion coefficient of the wiring substrate.

19. The semiconductor package of claim 17, further comprising a top stiffener disposed on the first surface of the wiring substrate, wherein a top surface of the top stiffener is leveled between the wiring substrate and a top surface of the semiconductor component away from the wiring substrate.

20. The semiconductor package of claim 17, wherein a lateral size of the bottom stiffener is proximate to one of the conductor terminals.

\* \* \* \* \*